(12) United States Patent
Lee et al.

(10) Patent No.: US 11,126,308 B2
(45) Date of Patent: Sep. 21, 2021

(54) INTEGRATOR, TOUCH DISPLAY DEVICE, AND DRIVING METHODS THEREFOR

(71) Applicant: LG Display Co., Ltd., Seoul (KR)

(72) Inventors: HongJu Lee, Seoul (KR); HyeongWon Kang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 8 days.

(21) Appl. No.: 16/209,516

(22) Filed: Dec. 4, 2018

(65) Prior Publication Data
US 2019/0187832 A1    Jun. 20, 2019

(30) Foreign Application Priority Data

Dec. 14, 2017 (KR) .......................... 10-2017-0172001

(51) Int. Cl.
| | | |
|---|---|---|
| G06F 3/044 | (2006.01) | |
| G06F 3/041 | (2006.01) | |
| H03K 17/96 | (2006.01) | |
| G06F 3/038 | (2013.01) | |

(52) U.S. Cl.
CPC ............ *G06F 3/044* (2013.01); *G06F 3/0383* (2013.01); *G06F 3/0412* (2013.01); *G06F 3/0416* (2013.01); *H03K 17/9622* (2013.01); *G09G 2310/0291* (2013.01); *G09G 2310/0294* (2013.01); *G09G 2310/0297* (2013.01); *H03K 2217/96073* (2013.01); *H03K 2217/96074* (2013.01)

(58) Field of Classification Search
None
See application file for complete search history.

(56) References Cited

U.S. PATENT DOCUMENTS

| 8,514,191 B2 | 8/2013 | Wang et al. |
|---|---|---|
| 9,430,088 B1 * | 8/2016 | Lee .................. G06F 3/0416 |
| 9,569,035 B1 * | 2/2017 | Lee .................. G06F 3/04184 |
| 2011/0100728 A1 * | 5/2011 | Chen .................. G06F 3/044 |
| | | 178/18.06 |

(Continued)

FOREIGN PATENT DOCUMENTS

| JP | 2014-106864 A | 6/2014 |
|---|---|---|
| JP | 2015-121958 A | 7/2015 |
| JP | 2015-225381 A | 12/2015 |

*Primary Examiner* — Brian M Butcher
(74) *Attorney, Agent, or Firm* — Seed IP Law Group LLP

(57) ABSTRACT

The disclosure provides an integrator, a touch display device, and a driving method therefor which can perform amplification and integration functions together. The integrator includes an amplifier having a non-inverting input terminal to which a reference signal having a pulse waveform is supplied; at least one feedback capacitor; a first path switching unit configured to connect the feedback capacitor between an inverting input terminal and an output terminal of the amplifier during a rising period of the reference signal; and a second path switching unit configured to connect the feedback capacitor between the inverting input terminal and the output terminal of the amplifier during a falling period of the reference signal, wherein, during each of the rising period and the falling period of the reference signal, a voltage difference between the reference signal and a signal applied to the inverting input terminal of the amplifier is amplified and accumulated, and the amplified and accumulated voltage difference is output.

13 Claims, 10 Drawing Sheets

(56) References Cited

U.S. PATENT DOCUMENTS

| | | | |
|---|---|---|---|
| 2011/0102061 A1* | 5/2011 | Wang | G06F 3/044 |
| | | | 327/517 |
| 2011/0168907 A1 | 7/2011 | Jung | |
| 2014/0021966 A1* | 1/2014 | Shahrokhi | G06F 3/044 |
| | | | 324/679 |
| 2014/0035601 A1 | 2/2014 | Fujiyoshi | |
| 2014/0146010 A1 | 5/2014 | Akai et al. | |
| 2014/0176482 A1* | 6/2014 | Wei | G06F 3/044 |
| | | | 345/174 |
| 2015/0170611 A1* | 6/2015 | Noto | G09G 5/18 |
| | | | 345/173 |
| 2015/0177885 A1* | 6/2015 | Noto | G06F 3/044 |
| | | | 345/174 |
| 2015/0338989 A1 | 11/2015 | Noto | |
| 2016/0334902 A1* | 11/2016 | Li | G06F 3/0445 |
| 2018/0004353 A1* | 1/2018 | Shin | G02F 1/13338 |
| 2018/0121020 A1* | 5/2018 | Lee | G06F 3/0446 |
| 2018/0173342 A1* | 6/2018 | Lee | G06F 3/0418 |

\* cited by examiner

INTEGRATOR, TOUCH DISPLAY DEVICE, AND DRIVING METHODS THEREFOR

CROSS REFERENCE TO RELATED APPLICATION

This application claims priority from Korean Patent Application No. 10-2017-0172001, filed on Dec. 14, 2017, which is hereby incorporated by reference for all purposes as if fully set forth herein.

BACKGROUND

Technical Field

The present disclosure relates to an integrator, a touch display device, and driving methods therefor.

Description of the Related Art

With the advancement of an information-oriented society, various requirements for display devices for displaying images have been increasing, and use has recently been made of various display devices, such as Liquid Crystal Display (LCD) devices, Plasma Display Panel (PDP) devices, and Organic Light-Emitting Display (OLED) devices.

Among such display devices, there are touch display devices that depart from a conventional input scheme using a button, a keyboard, or a mouse, and can provide a touch-based input scheme which enables a user to easily, conveniently, and intuitively input information or commands.

Such a touch display device can determine whether there is a touch or touch coordinates (a touch position) by supplying a touch driving signal to all or some of multiple touch electrodes arranged in a touch screen panel and acquiring sensing signals from the touch electrodes.

In order to easily acquire sensing signals, the touch display device includes an amplifier and an integrator.

According to an increase in the resolution and size of the touch display device, the number of touch electrodes increase, and thus, the number of amplifiers and integrators included in the touch display device also increases in proportion to the number of touch electrodes.

This configuration not only increases the size of a touch circuit but also increases costs required by the touch display device and the amount of power consumed by the same.

BRIEF SUMMARY

With this background, an aspect of the present disclosure is to provide an integrator and a driving method therefor which can perform amplification and integration functions together.

Another aspect of the present disclosure is to provide an integrator and a driving method therefor which can accumulate difference values.

Still another aspect of the present disclosure is to provide an integrator and a driving method therefor which can adjust a gain.

Yet another aspect of the present disclosure is to provide a touch display device and a driving method therefor which can reduce the size of a touch circuit and the amount of power consumed by the touch display device.

In accordance with an aspect of the present disclosure, there may be provided an integrator including: an amplifier including a non-inverting input terminal to which a reference signal having a pulse waveform is supplied; at least one feedback capacitor; a first path switching unit configured to connect the feedback capacitor between an inverting input terminal and an output terminal of the amplifier during a rising period of the reference signal; and a second path switching unit configured to connect the feedback capacitor between the inverting input terminal and the output terminal of the amplifier during a falling period of the reference signal, wherein, during each of the rising period and the falling period of the reference signal, a voltage difference between the reference signal and a signal applied to the inverting input terminal of the amplifier is amplified and accumulated, and the amplified and accumulated voltage difference is output.

The first path switching unit and the second path switching unit may connect the feedback capacitor so that directions of currents flowing through the feedback capacitor during the rising period and the falling period of the reference signal are identical to each other.

The first path switching unit may include: a first rising switch connected between the inverting input terminal of the amplifier and a first electrode of the feedback capacitor; and a second rising switch connected between the output terminal of the amplifier and a second electrode of the feedback capacitor.

The second path switching unit may include: a first falling switch connected between the inverting input terminal of the amplifier and the second electrode of the feedback capacitor; and a second falling switch connected between the output terminal of the amplifier and the first electrode of the feedback capacitor.

The first and second rising switches may be turned on before a rising edge of the reference signal, and the first and second falling switches may be turned on before a falling edge of the reference signal.

Among a pair of the first rising switch and the second falling switch and a pair of the second rising switch and the first falling switch, one pair thereof may have on-terms which partially overlap each other during the rising period or the falling period.

The first rising switch and the second falling switch may have on-terms which partially overlap each other during the falling period, and the second rising switch and the first falling switch may have on-terms which partially overlap each other during the rising period.

The integrator may further include a reset switch connected in parallel to the feedback capacitor between the inverting input terminal and the output terminal of the amplifier, configured to, during the rising period of the reference signal, be turned on after the first and second rising switches are turned off, and configured to, during the falling period of the reference signal, be turned on after the first and second falling switches are turned off.

The first rising switch and the first falling switch may be turned on earlier than the second rising switch and the second falling switch, respectively.

In the integrator, when the at least one feedback capacitor includes multiple feedback capacitors, the multiple feedback capacitors are connected in parallel to each other, and the integrator may further include multiple gain control switches connected to at least one of first and second electrodes of the multiple respective corresponding feedback capacitors.

In accordance with another aspect of the present disclosure, there may be provided a method for driving an integrator, wherein the integrator includes: an amplifier including a non-inverting input terminal to which a reference signal having a pulse waveform is supplied; at least one feedback capacitor; a first rising switch connected between an inverting input terminal of the amplifier and a first electrode of the feedback capacitor; a second rising switch connected between an output terminal of the amplifier and a second electrode of the feedback capacitor; a first falling switch connected between the inverting input terminal of the amplifier and the second electrode of the feedback capacitor; and a second falling switch connected between the output terminal of the amplifier and the first electrode of the feedback capacitor.

The method for driving the integrator may include: turning on first and second rising switches before a rising edge of the reference signal; turning off the first and second rising switches before a falling edge of the reference signal; turning on first and second falling switches before the falling edge of the reference signal; and turning off the first and second falling switches before a rising edge of the reference signal.

In accordance with still another aspect of the present disclosure, there may be provided a touch display device including: a panel having multiple touch electrodes arranged therein; and a touch circuit configured to supply a touch driving signal having a pulse waveform to at least one touch electrode among the multiple touch electrodes, and generate a sensing signal by using a signal from the touch electrode.

The touch circuit may generate the sensing signal by amplifying and accumulating a voltage difference between the touch driving signal and the signal received from the touch electrode during each of a rising period and a falling period of the touch driving signal.

In accordance with yet another aspect of the present disclosure, there may be provided a method for driving a touch display device including a touch circuit and a panel having multiple touch electrodes arranged therein.

The method for driving the touch display device may include: supplying, by the touch circuit, a touch driving signal having a pulse waveform to at least one touch electrode among the multiple touch electrodes; and generating, by the touch circuit, a sensing signal by using a signal from the touch electrode.

The generating of the sensing signal may include generating the sensing signal by amplifying and accumulating a voltage difference between the touch driving signal and the signal from the touch electrode during each of a rising period and a falling period of the touch driving signal.

In accordance with a further aspect of the present disclosure, there may be provided an integrator including: an amplifier including a non-inverting input terminal, an inverting input terminal, and an output terminal; a feedback capacitor including a first electrode and a second electrode; a first switch connected between the inverting input terminal of the amplifier and the first electrode of the feedback capacitor; a second switch connected between the output terminal of the amplifier and the second electrode of the feedback capacitor; a third switch connected between the inverting input terminal of the amplifier and the second electrode of the feedback capacitor; and a fourth switch connected between the output terminal of the amplifier and the first electrode of the feedback capacitor.

The above-described embodiments of the present disclosure can provide an integrator and a driving method therefor which are capable of performing amplification and integration functions together.

The above-described embodiments of the present disclosure can provide an integrator and a driving method therefor which are capable of accumulating difference values.

The above-described embodiments of the present disclosure can provide an integrator and a driving method therefor which are capable of adjusting a gain.

The above-described embodiments of the present disclosure can provide a touch display device and a driving method therefor which are capable of reducing the size of a touch circuit and the amount of power consumed by the touch display device.

BRIEF DESCRIPTION OF THE SEVERAL VIEWS OF THE DRAWINGS

The above and other aspects, features, and advantages of the present disclosure will be more apparent from the following detailed description taken in conjunction with the accompanying drawings, in which.

DETAILED DESCRIPTION

Figure 1:
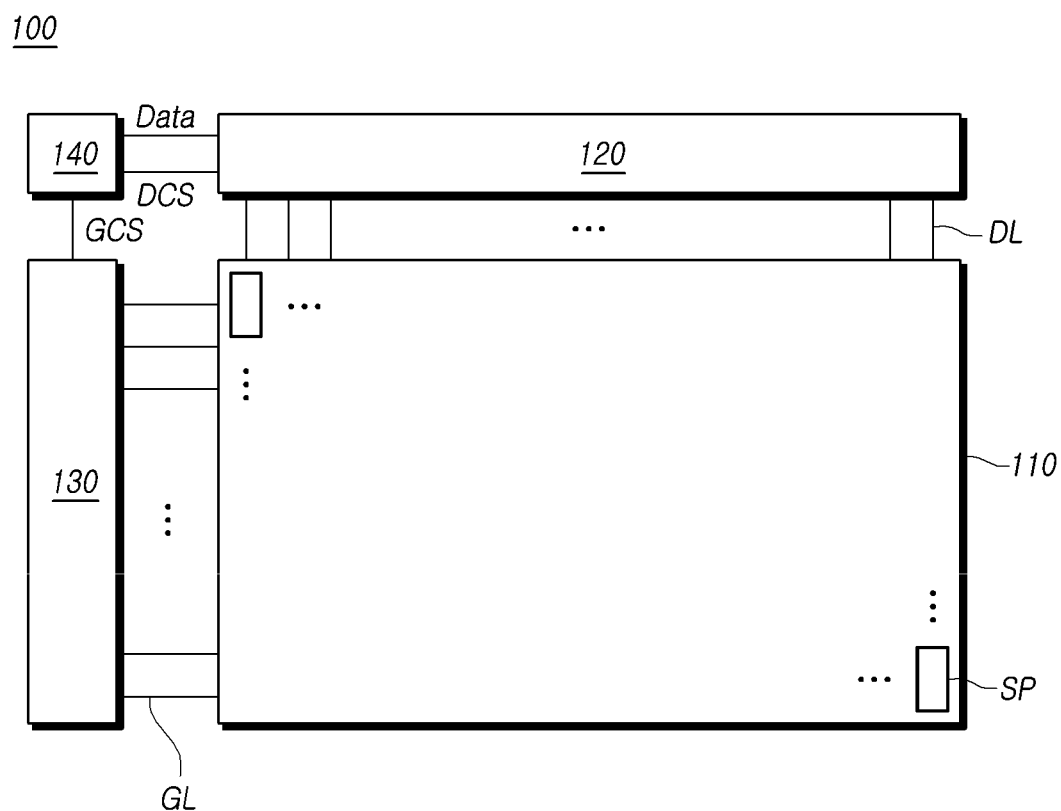
FIGS. 1 and 2 are views illustrating a system configuration of a touch display device according to embodiments of the present disclosure.

Hereinafter, exemplary embodiments of the present disclosure will be described in detail with reference to the accompanying drawings. In assigning reference numerals to elements in the drawings, the same reference numerals will designate the same elements where possible although they are shown in different drawings. Also, in the following description of the present disclosure, a detailed description of known functions and configurations incorporated herein will be omitted when it may make the subject matter of the present disclosure rather unclear.

In addition, such terms as "first", "second", "A", "B", "(a)", "(b)", and the like, may be used herein when describing elements of the present disclosure. These terms are merely used to distinguish one element from other elements, and the essence of a corresponding element, an order thereof, a sequence thereof, or the number of the corresponding elements are not limited by the terms. When an element is described as being "connected", "coupled", or "linked" to another element, it will be understood that the element may not only be directly connected or coupled to said another element, but may also be "connected", "coupled", or "linked" to said another element through a third element, or the third element may also be interposed between the element and said another element.

Figure 2:
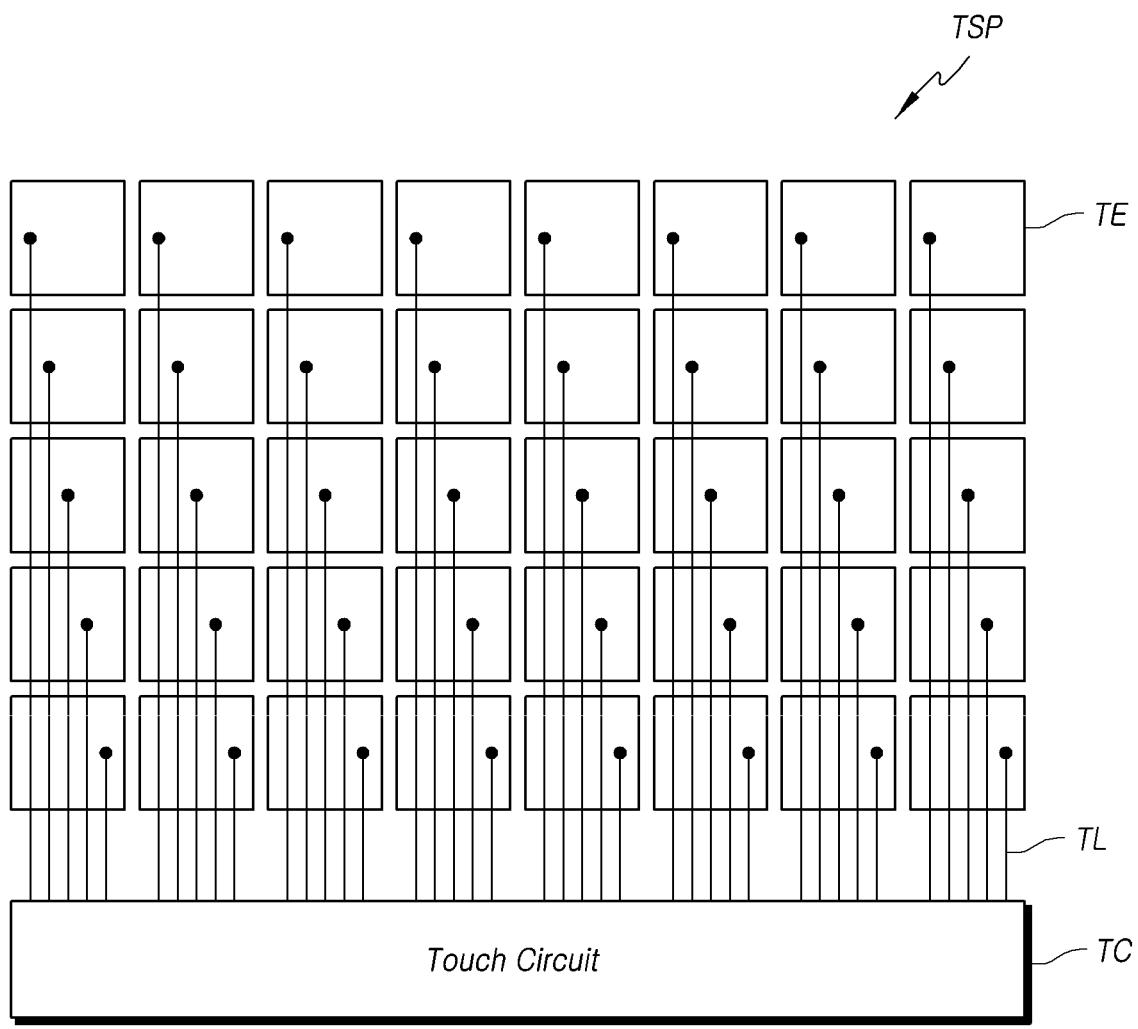

FIGS. 1 and 2 are views illustrating a system configuration of a touch display device according to embodiments of the present disclosure.

The touch display device according to embodiments of the present disclosure may include a display part configured to provide an image display function, and a touch sensing part configured to sense a touch.

FIG. 1 is a view illustrating the display part of the touch display device, and FIG. 2 is a view illustrating the touch sensing part thereof.

Referring to FIG. 1, the display part of the touch display device according to embodiments of the present disclosure may include a display panel 110, a data driving circuit 120, a gate driving circuit 130, a controller 140, and the like.

The display panel 110 has multiple data lines DL and multiple gate lines GL arranged therein, and has multiple sub-pixels SP, which are formed adjacent to the overlapping locations of the multiple data lines DL and gate lines GL, arranged therein.

The data driving circuit 120 drives the multiple data lines DL by supplying data voltages to the multiple data lines DL.

The gate driving circuit 130 drives the multiple gate lines GL by sequentially supplying a scan signal to the multiple gate lines GL.

The controller 140 controls operations of the data driving circuit 120 and the gate driving circuit 130 by respectively supplying various control signals such as data control signals DCS and gate control signals GCS to the data driving circuit 120 and the gate driving circuit 130.

The controller 140: starts a scan according to timing implemented in each display frame; changes input image data, which is input from the outside, so as to meet a data signal format used by the data driving circuit 120, and outputs the changed image data Data; and controls data driving at an appropriate time according to the scan.

The controller 140 may be a timing controller used by the conventional display technology or a control apparatus that includes the timing controller and further performs other control functions.

The controller 140 may be implemented as a component separate from the data driving circuit 120, or may be implemented as an incorporated component together with the data driving circuit 120. For example, the controller 140 may be implemented as an Integrated Circuit (IC), a microprocessor, a control circuit, or the like that is capable of processing signals and outputting signals according to the implemented commands or instructions.

The data driving circuit 120 may be implemented such that the same includes at least one source driver integrated circuit SDIC.

Each source driver integrated circuit SDIC may include a shift register, a latch circuit, a digital-to-analog converter DAC, an output buffer, and the like.

According to the circumstances, each source driver integrated circuit SDIC may further include an analog-to-digital converter ADC.

The gate driving circuit 130 may be implemented such that the same includes at least one gate driver integrated circuit GDIC.

Each gate driver integrated circuit GDIC may include a shift register, a level shifter, and the like.

The data driving circuit 120 may be disposed on only one side (e.g., the upper or lower side) of the display panel 110, or may be disposed on both sides (e.g., the upper and lower sides) of the display panel 110 according to a driving scheme, a panel design scheme, and the like in some cases.

The gate driving circuit 130 may be disposed on only one side (e.g., the left or right side) of the display panel 110, or may be disposed on both sides (e.g., the left and right sides) of the display panel 110 according to a driving scheme, a panel design scheme, and the like in some cases.

The display panel 110 may be various types of display panels, including an LCD panel, an OLED panel, a PDP, and the like.

Referring to FIG. 2, the touch sensing part according to embodiments of the present disclosure may include a touch panel TSP having multiple touch electrodes TE arranged therein, and a touch circuit TC configured to drive the touch panel TSP.

The touch sensing part may provide a mutual capacitance-based touch sensing function of sensing a touch input by measuring a capacitance or a change in the capacitance generated between each pair of touch electrodes TE, or may provide a self-capacitance-based touch sensing function of sensing a touch input by measuring a capacitance or a change in the capacitance generated at each touch electrode TE.

Hereinafter, for convenience of description, consideration is given to a case where the touch display device provides a self-capacitance-based touch sensing scheme and the touch panel TSP is designed as illustrated in FIG. 2 for self-capacitance-based touch sensing.

Referring to FIG. 2, for self-capacitance-based touch sensing, the touch panel TSP may have multiple touch electrodes TE arranged therein.

One touch electrode TE may be of the type of electrode that does not include an opening portion or open area, may be of the type of electrode including multiple holes, may be a mesh-type electrode, or may be a comb teeth-shaped electrode, or the like.

A touch driving signal may be applied to each of the multiple touch electrodes TE, and a sensing signal may be sensed from each thereof.

Each of the multiple touch electrodes TE may be electrically connected to the touch circuit TC through at least one touch line TL.

The touch panel TSP may be manufactured separately from the display panel 110 and may be bonded to the display panel 110, or may be mounted within the display panel 110.

When the touch panel TSP is mounted within the display panel 110, the touch panel TSP may be regarded as an aggregation of multiple touch electrodes TE and multiple touch lines TL.

When the touch panel TSP is mounted within the display panel 110, the multiple touch electrodes TE may be arranged in an in-cell or on-cell type, and may be manufactured together with the display panel 110.

When the touch panel TSP is mounted within the display panel 110, the multiple touch electrodes TE may be common electrode blocks to which a touch driving signal is applied or from which sensing signals are acquired during a touch interval for touch sensing, or to which a common voltage is applied during a display interval for image display.

During a display interval, all of the multiple touch electrodes TE may be electrically connected within the touch circuit TC, and may receive a common voltage Vcom applied in common thereto.

During a touch interval, some or all of the multiple touch electrodes TE may be selected within the touch circuit TC, and the touch circuit TC may apply a touch driving signal to the at least one selected touch electrode TE, or may acquire sensing signals therefrom.

As an example, the touch circuit TC may supply a touch driving signal having a pulse waveform to at least one touch electrode among the multiple touch electrodes TE of the touch panel TSP, and may receive a signal from the touch electrode so as to generate a sensing signal.

Hereinafter, for convenience of description, a description will be made based on consideration given to a case in which the touch panel TSP is implemented to be mounted within the display panel 110, and the display panel 110 and the touch panel TSP will not be separately distinguished from each other. That is, in embodiments of the present disclosure, the term "panel" refers to a display panel 110 having a built-in touch panel TSP.

Figure 3:
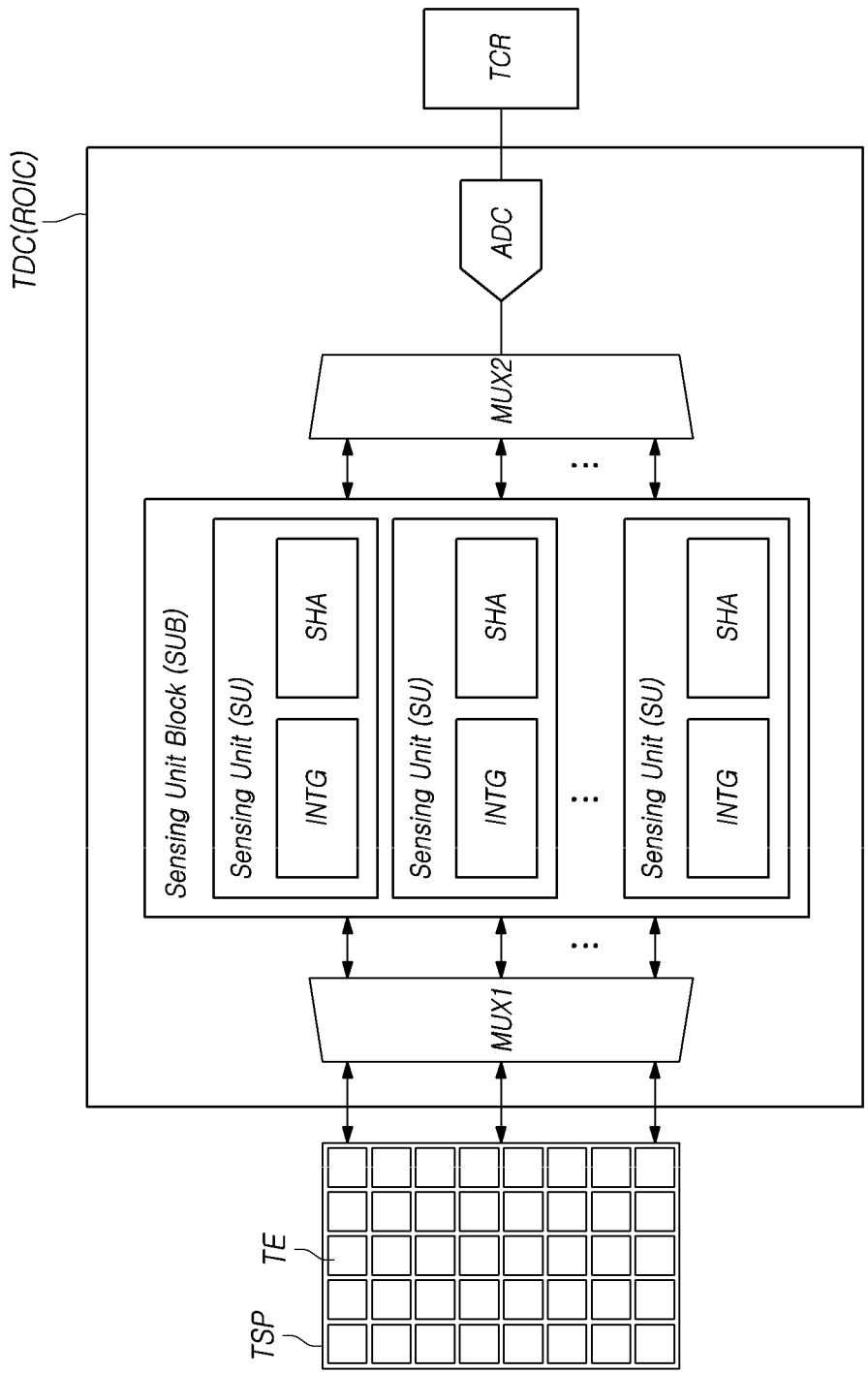
FIG. 3 is a block diagram illustrating a configuration of a touch circuit according to embodiments of the present disclosure.

FIG. 3 is a block diagram illustrating a configuration of a touch circuit according to embodiments of the present disclosure.

Referring to FIG. 3, the touch circuit TC may include a touch driver TDC, a touch controller TCR, and the like.

The touch driver TDC may be configured to generate a sensing signal by driving the touch panel TSP.

As an example, the touch driver TDC may supply a touch driving signal to all or some of the multiple touch electrodes TE arranged in the touch panel TSP, and may generate a sensing signal by using a signal from at least one touch electrode TE.

The touch driver TDC may supply a touch driving signal to at least one touch electrode TE through at least one touch line TL, and may generate a sensing signal.

The touch driver TDC delivers, to the touch controller TCR, the generated sensing signal or sensing data obtained by signal-processing the sensing signal.

The touch controller TCR may acquire whether there is a touch and/or touch coordinates by using the sensing signal or sensing data which is output from the touch driver TDC.

Then, the touch controller TCR may generate a touch driving signal and may transmit the generated touch driving signal to the touch driver TDC.

Also, the touch controller TCR may control operation timing of the touch driver TDC by transmitting a set value to the touch driver TDC.

The touch driver TDC and the touch controller TCR may be separately implemented, or may be implemented to be integrated in one element.

However, when the touch panel TSP is mounted within the display panel 110, the touch controller TCR may be integrated into the controller 140 so as to be implemented as one element.

The touch driver TDC may be implemented such that the same includes at least one touch driving circuit ROIC.

As an example, FIG. 3 illustrates a case in which the touch driver TDC includes one touch driving circuit ROIC.

Referring to FIG. 3, the touch driving circuit ROIC may include a first multiplexer circuit MUX1, a sensing unit block SUB including multiple sensing units SU, a second multiplexer circuit MUX2, an analog-to-digital converter ADC, and the like.

Each of the multiple sensing units SU is configured to generate a sensing signal from a signal received from a touch electrode TE.

The signal received from the touch electrode TE is changed according to whether there is a touch, and the sensing unit SU generates a sensing signal by amplifying and integrating the difference between the touch driving signal and a signal which is changed according to whether there is a touch and is received from the touch electrode TE.

In embodiments of the present disclosure, each of the multiple sensing units SU may include an integrator INTG, a sample-and-hold circuit SHA, and the like.

One sample-and-hold circuit SHA may be included in each sensing unit SU. Alternatively, one sample-and-hold circuit SHA may be disposed in at least two sensing units SU, and according to the circumstances, one sample-and-hold circuit SHA may be disposed in all of the multiple sensing units SU.

The sample-and-hold circuit SHA, which is a circuit disposed on an input side of the analog-to-digital converter ADC, is configured to sample and hold the voltage of an input signal and maintain the held voltage without any change until the analog-to-digital converter ADC finishes the previous conversion.

In the touch driving circuit ROIC, the sample-and-hold circuit SHA is used to maintain a sensing signal which is output from the integrator INTG.

The analog-to-digital converter ADC converts, into digital data, the voltage of the sensing signal being maintained by the sample-and-hold circuit SHA, and outputs the sensing data.

When the touch driver TDC (or the touch driving circuit ROIC) is configured to output a sensing signal as it is without converting the sensing signal into digital data, the sample-and-hold circuit SHA and the analog-to-digital converter ADC may be omitted.

The first multiplexer circuit MUX1 may be configured such that even a small number of sensing units SU can sense a large number of touch electrodes TE. The first multiplexer circuit MUX1 may simultaneously select one or more touch electrodes TE among the multiple touch electrodes TE.

Then, the first multiplexer circuit MUX1 delivers a touch driving signal to the selected touch electrodes TE, or delivers signals, received from the touch electrodes TE, to the integrator INTG of the relevant sensing unit SU within the sensing unit block SUB.

The second multiplexer circuit MUX2 is configured to select one sensing unit among the multiple sensing units SU and deliver, to the analog-to-digital converter ADC, the voltage being maintained by the sample-and-hold circuit SHA of the selected sensing unit.

The integrator INTG is configured to generate a sensing signal by amplifying and integrating the difference between the touch driving signal and the signal received from the touch electrode TE.

In an existing touch circuit, the difference between signals, received from touch electrodes TE and changed according to whether there is a touch, is not large and thus the existing touch circuit separately includes an amplifier, which amplifies a signal so that whether there is a touch can be accurately determined, and an integrator that accumulates the amplified signals.

This is because the amplifier only amplifies a signal and the integrator only accumulates signals in the existing touch circuit and thus the former and the latter perform functions distinguished from each other.

However, the integrator INTG according to embodiments of the present disclosure is configured to be capable of performing amplification and integration functions together, and thus does not require an amplifier.

The integrator INTG according to embodiments of the present disclosure generates a sensing signal by amplifying and integrating the difference between a touch driving signal and a signal received from a touch electrode TE.

Also, the existing integrator may accumulate a signal for only one term in a rising period (a high-level period) or a falling period (a low-level period) of a touch driving signal.

That is, the existing integrator may accumulate a signal only once during one cycle time of a touch driving signal having a pulse waveform.

According to the circumstances, a sensing unit additionally includes a separate sampling circuit, which controls the phase of a signal applied to an integrator, and is configured to be capable of accumulating signals during all rising and falling periods of a touch driving signal.

However, problems arise in that the addition of the sampling circuit causes an increase in the size of a sensing unit, required costs, and the amount of required power consumption.

However, the integrator INTG according to embodiments of the present disclosure is configured such that a switch is simply added to the existing integrator circuit so as to change the configuration thereof, making it possible to not only perform both amplification and accumulation functions but also accumulate signals during all rising and falling periods.

That is, the integrator INTG may accumulate signals twice during one cycle time of a touch driving signal. Accordingly, the integrator INTG according to embodiments of the present disclosure may generate a sensing signal more quickly than the existing integrator.

As a result, the touch circuit TC according to embodiments of the present disclosure as illustrated in FIG. 3 can not only amplify a signal but can also accumulate signals by using only an integrator, so as to reduce the size of the touch circuit TC, the amount of power consumed by the touch circuit TC, and the manufacturing cost thereof.

In addition, the touch circuit TC can accumulate the difference value between a touch driving signal and a signal received from a touch electrode TE. Further, the touch circuit TC can amplify and accumulate the voltage difference between a touch driving signal and a signal received from a touch electrode during each of a rising period and a falling period of the touch driving signal, so as to quickly generate a sensing signal.

Figure 4:
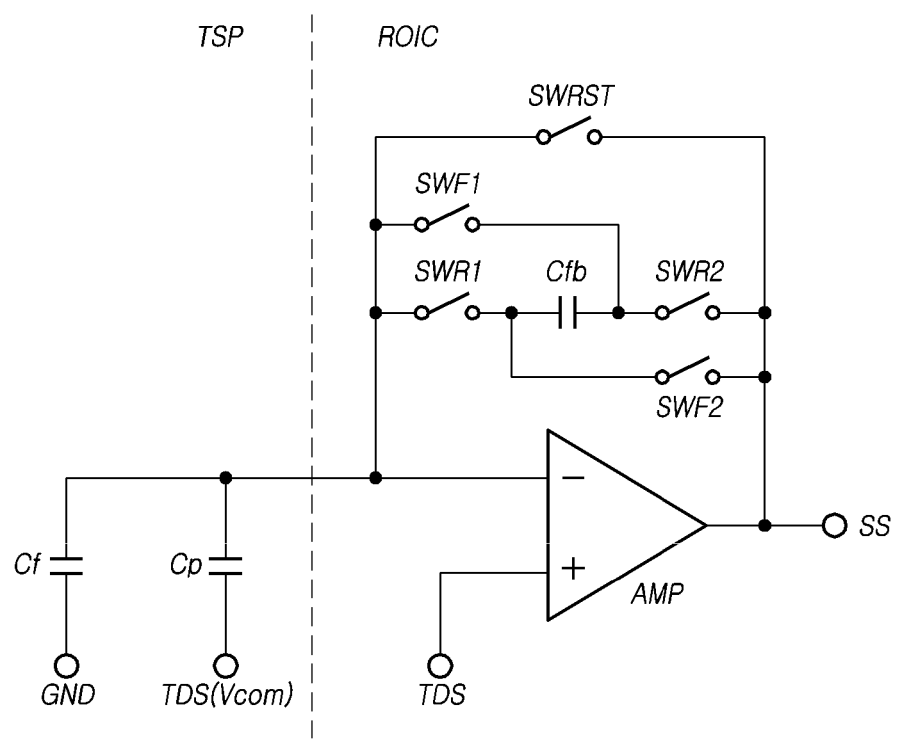
FIG. 4 is a circuit diagram illustrating an example of an integrator according to embodiments of the present disclosure.
Figure 5:
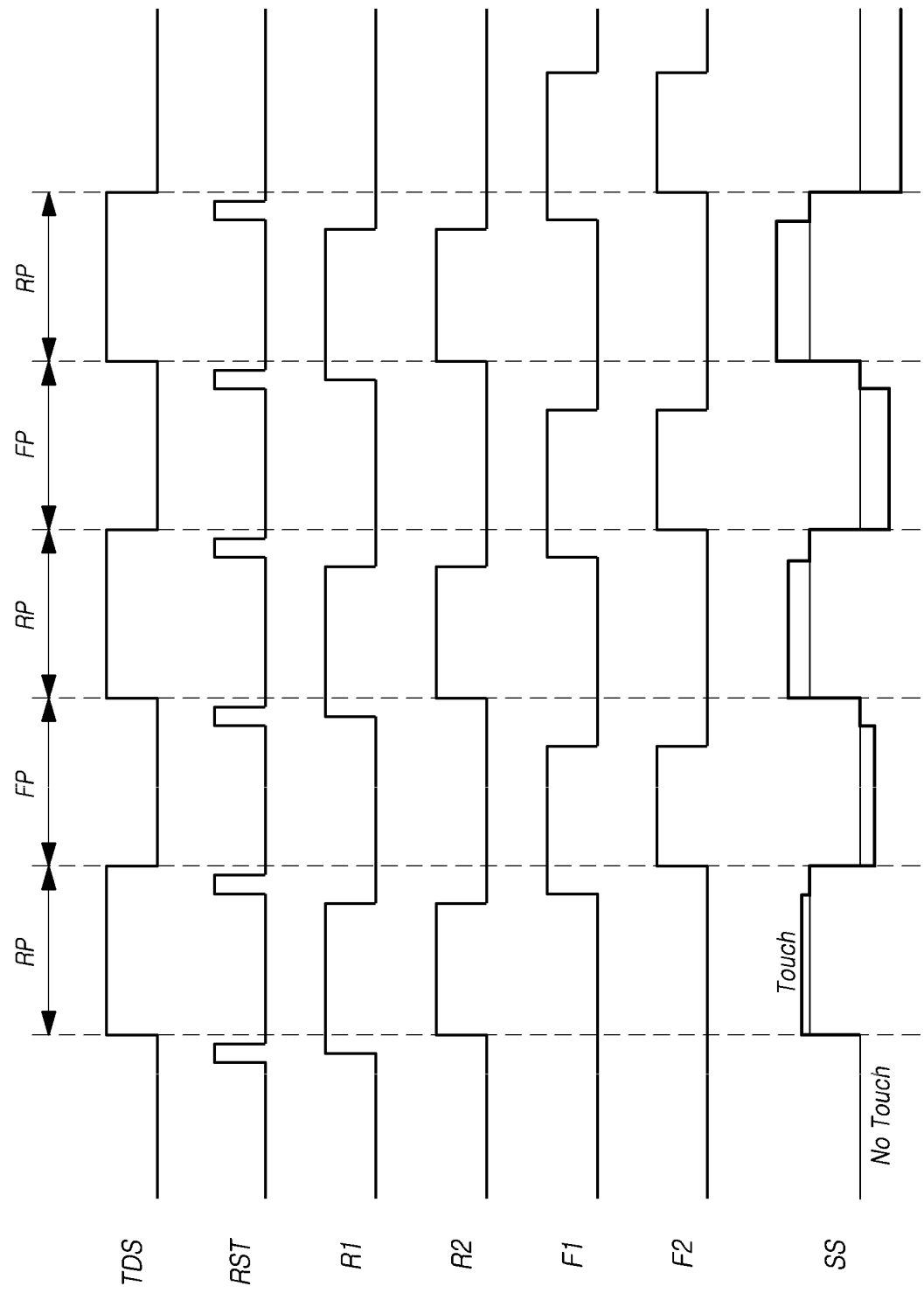
FIG. 5 is a timing diagram for explaining an operation of the integrator of FIG. 4.

FIG. 4 is a circuit diagram illustrating an example of an integrator according to embodiments of the present disclosure. FIG. 5 is a timing diagram for explaining an operation of the integrator of FIG. 4.

Referring to FIG. 4, the integrator according to embodiments of the present disclosure includes an amplifier AMP, a feedback capacitor Cfb, and multiple switches SWR1, SWR2, SWF1, SWF2, and SWRST.

More specifically, the integrator includes: an amplifier AMP including a non-inverting input terminal, an inverting input terminal, and an output terminal; a feedback capacitor Cfb including a first electrode and a second electrode; a first switch SWR1 connected between the inverting input terminal of the amplifier AMP and the first electrode of the feedback capacitor Cfb; a second switch SWR2 connected between the output terminal of the amplifier AMP and the second electrode of the feedback capacitor Cfb; a third switch SWF1 connected between the inverting input terminal of the amplifier AMP and the second electrode of the feedback capacitor Cfb; and a fourth switch SWF2 connected between the output terminal of the amplifier AMP and the first electrode of the feedback capacitor Cfb.

Also, the integrator further includes a fifth switch connected between the first and second electrodes of the feedback capacitor Cfb.

During a touch interval, a touch driving signal TDS having a pulse waveform is supplied to the non-inverting input terminal of the amplifier AMP. Also, the inverting input terminal of the amplifier AMP is connected to at least one touch electrode TE selected by the first multiplexer circuit MUX1.

In the present example, the touch electrode TE has capacitance components, such as a self-capacitance of the touch electrode TE itself and a mutual capacitance due to an interaction between various line paths (e.g., gate lines GL, data lines DL, and touch lines TL) within the touch panel TSP and the display panel 110 and touch electrodes adjacent to the various line paths.

In FIG. 4, such a capacitance component of the touch electrode TE is illustrated as a panel capacitor Cp.

As described above, since the touch driving signal TDS is supplied to the touch electrode TE, the touch driving signal TDS is supplied to one terminal of the panel capacitor Cp.

Also, the other terminal of the panel capacitor Cp is connected to the inverting input terminal of the amplifier AMP.

Since the capacitance component of the touch electrode TE is a capacitance generated regardless of whether there is a touch and is generated according to the characteristics of the touch panel TSP, the panel capacitor Cp may generally have a capacitance value within a predetermined range. That is, the capacitance of the panel capacitor Cp may be regarded as having a constant value regardless of whether the touch panel TSP is driven.

When an object, such as a person's finger, having a predetermined capacitance touches the touch electrode TE (in some cases, a case in which the object comes close to the touch electrode TE but does not touch or contact the surface of the display is also included), the relevant capacitance affects the touch electrode TE.

In FIG. 4, a capacitance component due to the touch object is illustrated as a finger capacitor Cf.

The finger capacitor Cf corresponds to a capacitance component generated by the touch object as described above, and thus is excluded when no touch occurs.

The finger capacitor Cf may be regarded as being also connected to the inverting input terminal of the amplifier AMP through the touch electrode TE.

Accordingly, the amplifier AMP amplifies and outputs the voltage difference between the touch driving signal TDS, which is input to the non-inverting input terminal thereof, and a signal which is input to the inverting input terminal through the touch electrode TE.

In the present example, the touch driving signal TDS may be regarded as being used as a reference signal for determining a voltage level of the signal received through the touch electrode TE.

The feedback capacitor Cfb may be connected in parallel between the inverting input terminal and the output terminal of the amplifier AMP through the multiple switches SWR1, SWR2, SWF1, and SWF2.

The feedback capacitor Cfb may accumulate and store signals which are amplified and output by the amplifier AMP. Also, the feedback capacitor Cfb may adjust an amplification gain of the amplifier AMP.

In the present example, the feedback capacitor Cfb may include multiple capacitors connected in parallel to each other.

The first switch SWR1 and the second switch SWR2 among the multiple switches SWR1, SWR2, SWF1, SWF2, and SWRST are a first rising switch SWR1 and a second rising switch SWR2, respectively, and constitute a first path switching unit for electrically connecting the feedback capacitor Cfb between the inverting input terminal and the output terminal of the amplifier AMP during a rising period RP (e.g., a high-level period) of a touch driving signal.

In the present example, the first rising switch SWR1 is connected between the inverting input terminal of the amplifier AMP and the first electrode of the feedback capacitor Cfb. Also, the second rising switch SWR2 is connected between the output terminal of the amplifier AMP and the second electrode of the feedback capacitor Cfb.

The third switch SWF1 and the fourth switch SWF2 are a first falling switch SWF1 and a second falling switch SWF2, respectively, and constitute a second path switching unit for electrically connecting the feedback capacitor Cfb between the inverting input terminal and the output terminal of the amplifier AMP during a falling period FP (e.g., a low-level period) of the touch driving signal.

The first falling switch SWF1 of the second path switching unit is connected between the inverting input terminal of the amplifier AMP and the second electrode of the feedback capacitor Cfb. Also, the second falling switch SWF2 is connected between the output terminal of the amplifier AMP and the first electrode of the feedback capacitor Cfb.

That is, as illustrated in FIG. 4, the first path switching unit and the second path switching unit has a structure in which the first electrode and the second electrode of the feedback capacitor Cfb are connected to the inverting input terminal and the output terminal of the amplifier AMP so that the former inverts the latter and the latter inverts the former.

The purpose of this structure is to induce directions of respective currents flowing through the feedback capacitor Cfb during a rising period RP and a falling period FP of a touch driving signal TDS to be identical.

When the directions of the respective currents flowing through the feedback capacitor Cfb during the rising period RP and the falling period FP of the touch driving signal TDS are identical as described above, the feedback capacitor Cfb may accumulate and store the voltage difference between the touch driving signal TDS and a signal, applied to the inverting input terminal of the amplifier AMP, during each of the rising period RP and the falling period FP of the touch driving signal TDS.

The fifth switch SWRST, which is connected between the inverting input terminal and the output terminal of the amplifier AMP, is a reset switch. The reset switch SWRST is disposed in order to remove a parasitic capacitance component which may flow and enter into the inverting input terminal of the amplifier AMP.

The reset switch SWRST can remove an input offset to the inverting input terminal of the amplifier AMP by temporarily short-circuiting the inverting input terminal and the output terminal of the amplifier AMP.

Referring to FIG. 5, an operation of the integrator as illustrated in FIG. 4 is described. The touch driving circuit ROIC of the touch circuit TC may drive the touch panel TSP by supplying a touch driving signal TDS to touch electrodes TE during a touch interval.

In the present example, the touch driving signal TDS may be generated by the touch controller TCR, or may be generated and transmitted by a separate signal generation circuit under the control of the touch controller TCR.

Also, a touch interval may be designated by the controller 140 of the touch display device, and may be distinguished from or may overlap a display interval.

As illustrated in FIG. 5, the touch driving circuit ROIC turns on or off the multiple switches SWR1, SWR2, SWF1, SWF2, and SWRST at designated timings according to pre-stored set values.

Although not illustrated, the touch driving circuit ROIC may include a config register and a timing generator. Also, the config register receives and stores a set value from the touch controller TCR, and the timing generator controls various circuits within the touch driving circuit ROIC according to set values stored in the config register.

Particularly, in the touch driving circuit ROIC according to embodiments of the present disclosure, the timing generator may control on/off timing of the multiple switches SWR1, SWR2, SWF1, SWF2, and SWRST.

In the present disclosure, a rising period of a touch driving signal TDS signifies a high-level period of the touch driving signal TDS having a pulse waveform, and a falling period thereof signifies a low-level period.

Referring to FIG. 5, first, as first and second rising signals R1 and R2 transition to a first level (e.g., a high level) before or at the same time of a rising edge of the touch driving signal TDS, the first and second rising switches SWR1 and SWR2 are turned on. At this time, the first and second falling switches SWF1 and SWF2 are both in an off-state by first and second falling signals F1 and F2 both having a second level (e.g., a low level).

Accordingly, the feedback capacitor Cfb is connected in parallel between the inverting input terminal and the output terminal of the amplifier AMP by the first path switching unit.

Then, when the touch driving signal TDS transitions to the first level and has a rising period, the amplifier AMP amplifies the voltage difference between the touch driving signal TDS applied to the non-inverting input terminal and a signal applied to the inverting input terminal, and outputs the amplified voltage difference to the output terminal.

Hereinafter, for convenience of understanding, a description will be made based on consideration given to a case in which, when no touch to the touch panel TSP occurs, a touch driving signal TDS supplied to touch electrodes TE is re-applied to the inverting input terminal of the amplifier AMP without any change.

That is, consideration is given to a case in which the panel capacitor Cp illustrated in FIG. 4 is excluded. This is because, as described above, the capacitance of the panel capacitor Cp may be regarded as having a constant value regardless of whether the touch panel TSP is driven.

When consideration is given to a case in which the panel capacitor Cp is excluded, if no touch occurs, the touch panel TSP has no capacitance component, and thus, the touch driving signal TDS supplied to the touch electrodes TE is input to the inverting input terminal of the amplifier AMP without any change.

Accordingly, the touch driving signal TDS is identical to a signal applied to the inverting input terminal of the amplifier AMP, and thus, the amplifier AMP amplifies and outputs the touch driving signal TDS.

In the present example, a gain of the amplifier AMP may be set by the capacitance of the feedback capacitor Cfb.

When a touch occurs, the finger capacitor Cf illustrated in FIG. 4 may be regarded as being connected to the inverting input terminal of the amplifier AMP.

Also, a variation $\Delta Qf$ of the amount of charges due to the finger capacitor Cf may be calculated by $\Delta Qf = Cf \times \Delta Vtds$.

In the present example, $\Delta Vtds$ represents a variation of a voltage of the touch driving signal TDS, and $\Delta Vtds = Vtdsh - Vtdsl$. Vtdsh represents a voltage value at the first level (e.g., a high level) of the touch driving signal TDS, and Vtdsl represents a voltage value at the second level (e.g., a low level) of the touch driving signal TDS.

A variation ΔQfb of the amount of charges of the feedback capacitor Cfb, which is connected between the inverting input terminal and the output terminal of the amplifier AMP, is calculated by ΔQfb=Cfbx(Vss−Vtdsh).

In the present example, Vss represents a voltage level of a signal which is output from the output terminal of the amplifier AMP.

By this configuration, the total amount of charges Qfb accumulated in the feedback capacitor Cfb is calculated by Qfb=Qfb_b+ΔQfb. In the present example, Qfb_b represents the amount of charges stored in the feedback capacitor Cfb in the previous state.

As a result, a voltage Vss of a signal SS which is output from the output terminal is calculated by Vss=(Cf/Cfbx ΔVtds)+Vtdsh−(Vss_b−Vtdsl).

Vss_b represents a voltage level of a signal which is output from the output terminal of the amplifier AMP in the previous state.

Therefore, as illustrated in FIG. 5, with respect to a signal obtained by amplifying the touch driving signal TDS, a signal, which corresponds to the voltage difference between the touch driving signal TDS and a signal applied to the inverting input terminal of the amplifier AMP, is output.

Thereafter, since before and at the same time of a falling edge of the touch driving signal TDS, the first and second rising signals R1 and R2 both transition to the second level and the first and second falling signals F1 and F2 both transition to the first level, the first and second rising switches SWR1 and SWR2 are turned off but the first and second falling switches SWF1 and SWF2 are tuned on.

That is, the feedback capacitor Cfb is connected in parallel between the inverting input terminal and the output terminal of the amplifier AMP by the second path switching unit in place of the first path switching unit.

In the present example, the first electrode of the feedback capacitor Cfb is connected to the output terminal of the amplifier AMP and the second electrode of the feedback capacitor Cfb is connected to the inverting input terminal of the amplifier AMP, and thus, the first and second electrodes of the feedback capacitor Cfb are inversely connected as compared with the case in which the first and second electrodes of the feedback capacitor Cfb are connected by the first path switching unit.

Thereafter, when the touch driving signal TDS transitions to the second level and has a falling period, the amplifier AMP amplifies the voltage difference between the touch driving signal TDS applied to the non-inverting input terminal thereof and a signal applied to the inverting input terminal thereof, and outputs the amplified voltage difference to the output terminal thereof.

In the present example, the purpose of a configuration, in which the second path switching unit respectively connects the first and second electrodes of the feedback capacitor Cfb to the output terminal and the inverting input terminal of the amplifier AMP, is to accumulate charges due to the occurrence of a touch in the feedback capacitor Cfb, wherein the connection is inversely made by the second path switching unit as compared with a connection made by the first path switching unit.

As illustrated in FIG. 5, when a touch occurs during a falling period, the amount of charges is increased with a polarity opposite to that in a rising period. That is, a current direction may be formed to be opposite to that in the rising period. Accordingly, when the feedback capacitor Cfb is connected to the amplifier AMP by the first path switching unit identically to the connection made in the rising period, the charges accumulated in the feedback capacitor Cfb cancel each other.

In order to prevent the above-described problems, in the present disclosure, the first path switching unit and the second path switching unit are distinguished from each other and connect the feedback capacitor Cfb to the amplifier AMP during rising and falling periods of the touch driving signal TDS.

By this configuration, a current path having the same direction is configured for the feedback capacitor Cfb regardless of rising and falling periods of the touch driving signal TDS. That is, the integrator according to embodiments of the present disclosure may accumulate the charges due to the occurrence of a touch during all rising and falling periods of the touch driving signal TDS.

During a rising period, the reset switch SWRST controlled by a reset signal RST is turned on after the first and second rising switches SWR1 and SWR2 are turned off, and is turned off before a falling edge of the touch driving signal TDS. Also, during a falling period, the reset switch SWRST is turned on after the first and second falling switches SWF1 and SWF2 are turned off, and is turned off before a rising edge of the touch driving signal TDS.

That is, the reset switch SWRST is temporarily turned on before a rising edge and a falling edge of the touch driving signal so as to remove an input offset to the inverting input terminal.

In FIG. 5, the first rising switch SWR1 and the first falling switch SWF1 are turned on earlier than the second rising switch SWR2 and the second falling switch SWF2, respectively.

Also, the first rising switch SWR1 and the first falling switch SWF1 may be turned on during a period for which the reset switch SWRST is turned on.

Typically, the capacitance of the panel capacitor Cp is much greater than that of the feedback capacitor Cfb. Accordingly, when the first rising switch SWR1 and the first falling switch SWF1 are turned on, a glitch may occur and thus large noise may be generated.

Accordingly, in embodiments of the present disclosure, the first rising switch SWR1 and the first falling switch SWF1 are turned on together during a period for which the reset switch SWRST is turned on, making it possible to remove noise caused by a glitch.

Figure 6:
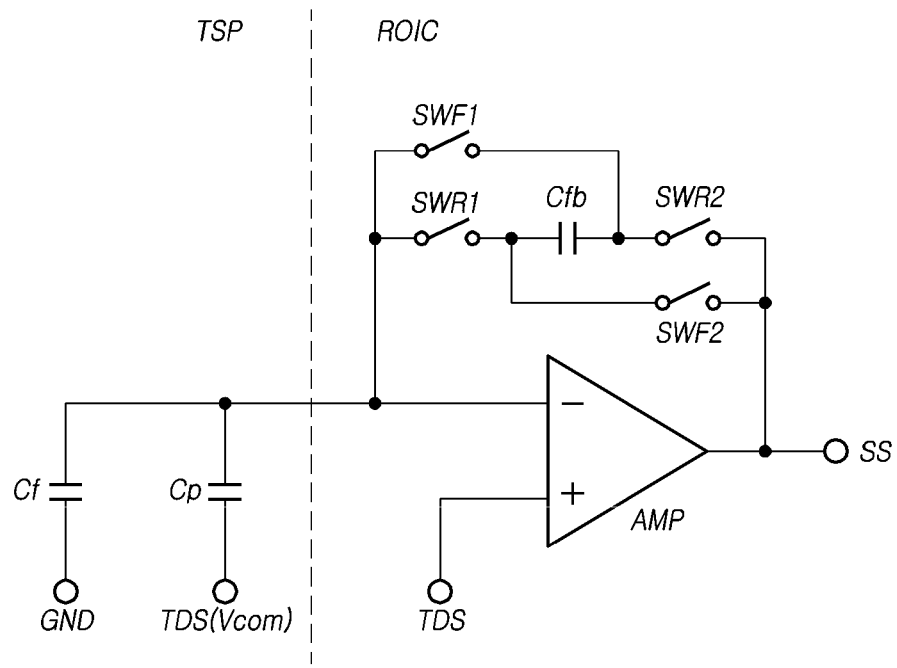
FIG. 6 is a circuit diagram illustrating another example of an integrator according to embodiments of the present disclosure.
Figure 7:
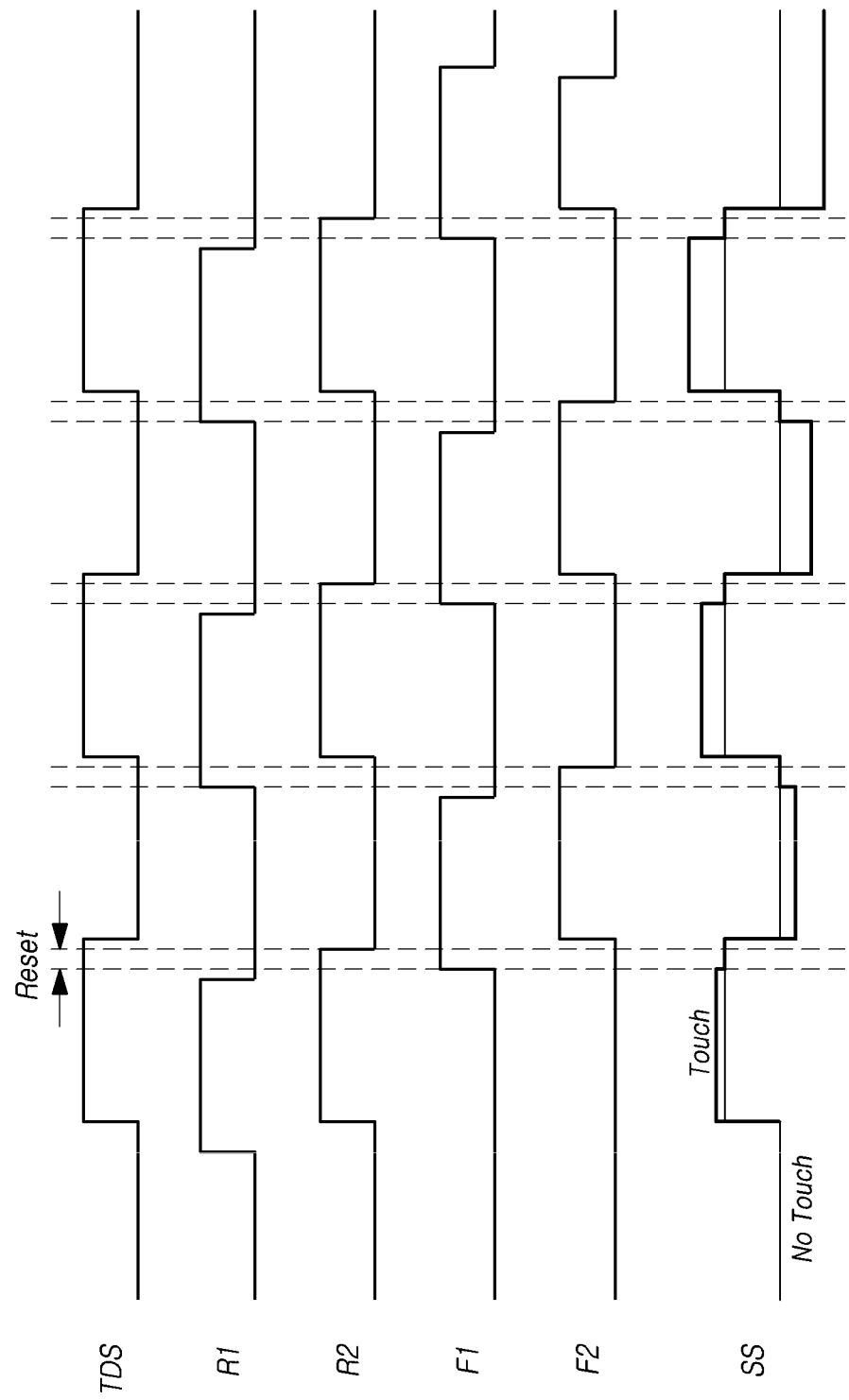
FIG. 7 is a timing diagram for explaining an operation of the integrator of FIG. 6.

FIG. 6 is a circuit diagram illustrating another example of an integrator according to embodiments of the present disclosure. FIG. 7 is a timing diagram for explaining an operation of the integrator of FIG. 6.

When the reset switch SWRST is omitted from the integrator illustrated in FIG. 4, the resulting configuration is identical to a configuration of the integrator illustrated in FIG. 6.

As described above, the reset switch SWRST is configured to temporarily short-circuit the inverting input terminal and the output terminal of the amplifier AMP and remove an input offset to the inverting input terminal thereof.

Alternatively, when the first and second rising switches SWR1 and SWR2 and the first and second falling switches SWF1 and SWF2 are selectively turned on, even without the reset switch SWRST, this configuration may short-circuit the inverting input terminal and the output terminal of the amplifier AMP.

From FIG. 6, it can be noted that when the first rising switch SWR1 and the second falling switch SWF2 are turned on or when the second rising switch SWR2 and the first falling switch SWF1 are turned on, the inverting input terminal and the output terminal of the amplifier AMP are short-circuited.

That is, in the integrator of FIG. 6 from which the reset switch SWRST is omitted, the first and second rising switches SWR1 and SWR2 and the first and second falling switches SWF1 and SWF2 may be controlled so as to be capable of replacing the function of the reset switch SWRST.

By this configuration, according to first and second rising signals R1 and R2 and first and second falling signals F1 and F2 illustrated in FIG. 7, a term for which the second rising switch SWR2 is turned on partially overlaps a term for which the first falling switch SWF1 is turned on, and a term for which the first rising switch SWR1 is turned on partially overlaps a term for which the second falling switch SWF2 is turned on.

In the present example, during a rising period RP, the turned-on second rising switch SWR2 and the turned-on first falling switch SWF1 may serve as the reset switch SWRST, and during a falling period FP, the turned-on first rising switch SWR1 and the turned-on second falling switch SWF2 may serve as the reset switch SWRST.

That is, in FIG. 7, during a rising period RP of a touch driving signal TDS and during a falling period FP thereof, different switch combinations serve as the reset switch SWRST.

Alternatively, during a rising period RP of a touch driving signal TDS and during a falling period FP thereof, the same switch combination may be configured to serve as the reset switch SWRST.

That is, regardless of a rising period RP and a falling period FP of the touch driving signal TDS, a combination of the second rising switch SWR2 and the first falling switch SWF1 may serve as the reset switch SWRST, or a combination of the first rising switch SWR1 and the second falling switch SWF2 may serve as the reset switch SWRST.

In this regard, both switch combinations should not be simultaneously turned on.

This is because when a combination of the second rising switch SWR2 and the first falling switch SWF1 and a combination of the first rising switch SWR1 and the second falling switch SWF2 are simultaneously turned on, the charges accumulated in the feedback capacitor Cfb are discharged and the integrator is reset.

Figure 8:
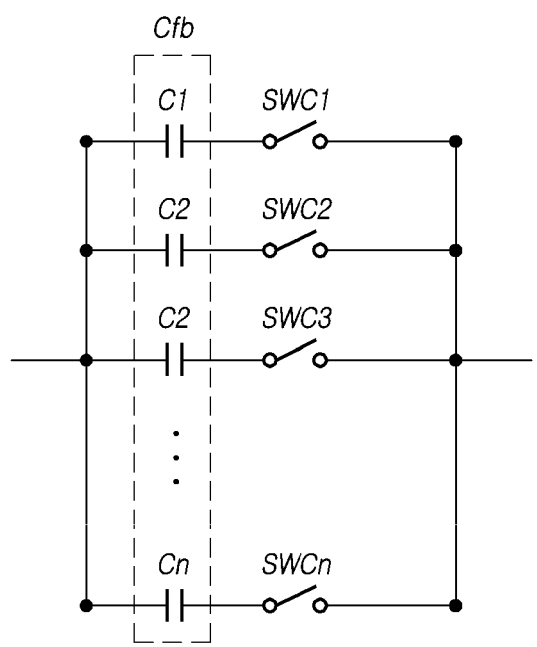
FIG. 8 is a circuit diagram illustrating an example of a feedback capacitor according to embodiments of the present disclosure.

FIG. 8 is a circuit diagram illustrating an example of a feedback capacitor according to embodiments of the present disclosure.

As illustrated in FIGS. 4 and 6, the feedback capacitor Cfb may be implemented by a single capacitor.

However, the integrator according to the present disclosure is configured to be capable of performing a function of an amplifier and a function of an integrator together, and thus, there may occur a case in which the integrator needs to adjust an amplification gain thereof.

Accordingly, FIG. 8 illustrates a case in which the feedback capacitor Cfb is implemented by multiple capacitors C1 to Cn connected in parallel to one another through multiple respective corresponding gain control switches SWC1 to SWCn.

When the feedback capacitor Cfb includes the multiple gain control switches SWC1 to SWCn and the multiple capacitors C1 to Cn as described above, a total capacitance of the feedback capacitor Cfb may be changed according to on/off of the gain control switches SWC1 to SWCn.

As a result, an amplification gain of the integrator may be adjusted.

Figure 9:
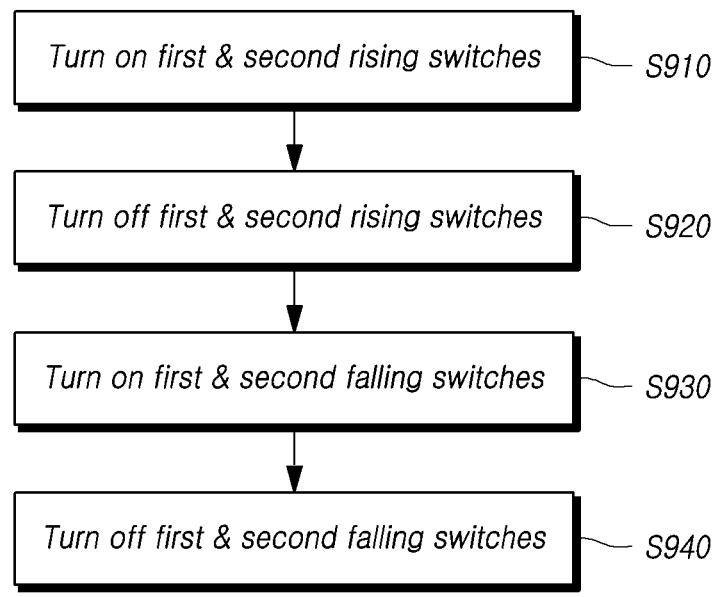
FIG. 9 is a flowchart illustrating a method for driving an integrator according to embodiments of the present disclosure.

FIG. 9 is a flowchart illustrating a method for driving an integrator according to embodiments of the present disclosure.

FIG. 9 illustrates a method for driving an integrator INTG, wherein the integrator INTG includes: an amplifier AMP including a non-inverting input terminal to which a touch driving signal TDS having a pulse waveform is supplied; at least one feedback capacitor Cfb; a first rising switch SWR1 connected between an inverting input terminal of the amplifier AMP and a first electrode of the feedback capacitor Cfb; a second rising switch SWR2 connected between an output terminal of the amplifier AMP and a second electrode of the feedback capacitor Cfb; a first falling switch SWF1 connected between the inverting input terminal of the amplifier AMP and the second electrode of the feedback capacitor Cfb; and a second falling switch SWF2 connected between the output terminal of the amplifier AMP and the first electrode of the feedback capacitor Cfb.

As illustrated in FIG. 9, the method for driving an integrator according to embodiments of the present disclosure may include: turning on first and second rising switches SWR1 and SWR2 before a rising edge of a touch driving signal TDS; turning off the first and second rising switches SWR1 and SWR2 before a falling edge of the touch driving signal TDS; turning on first and second falling switches SWF1 and SWF2 before the falling edge of the touch driving signal TDS; and turning off the first and second falling switches SWF1 and SWF2 before a rising edge of the touch driving signal TDS.

Accordingly, the integrator according to embodiments of the present disclosure may perform amplification and integration functions together, and may amplify and accumulate the voltage difference between the touch driving signal TDS and a signal applied to the inverting input terminal of the amplifier during each of a rising period and a falling period of the touch driving signal TDS.

In the present example, among a pair of the first rising switch SWR1 and the second falling switch SWF2 and a pair of the second rising switch SWR2 and the first falling switch SWF1, one pair thereof may have on-terms which partially overlap each other during a rising period or a falling period.

By this configuration, without including a separate reset switch SWRST, an input offset to the amplifier AMP can be removed.

Figure 10:
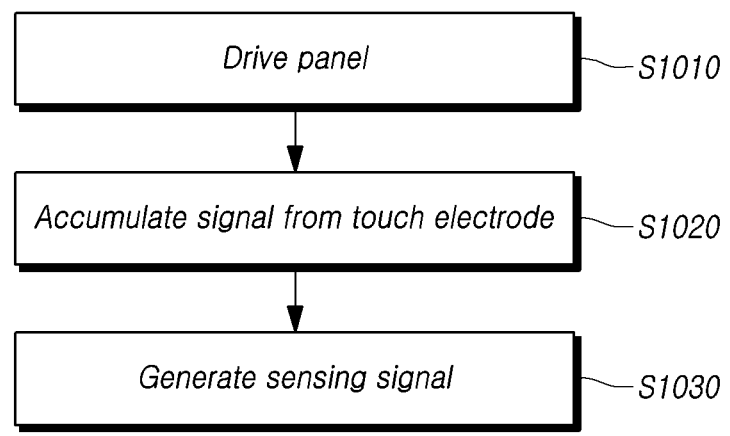
FIG. 10 is a flowchart illustrating a method for driving a touch display device according to embodiments of the present disclosure.

FIG. 10 is a flowchart illustrating a method for driving a touch display device according to embodiments of the present disclosure.

FIG. 10 illustrates the method for driving the touch display device including a panel TSP having multiple touch electrodes TE arranged therein and a touch circuit TC.

The method for driving the touch display device according to embodiments of the present disclosure may include: supplying a touch driving signal TDS, having a pulse waveform, to all or some of the multiple touch electrodes TE arranged in the panel TSP and driving all or some thereof, by the touch circuit TC; amplifying and accumulating, by the touch circuit TC, signals from the touch electrodes TE by using an integrator; and generating sensing signals by using the accumulated signals.

Accordingly, the touch circuit TC does not need to include a separate amplifier configured to amplify voltage differences between the touch driving signal TDS and the signals received from the touch electrodes, making it possible to reduce the size of the touch circuit and the amount of power consumed by the touch display device.

In the operation of accumulating signals from the touch electrodes, voltage differences between the touch driving signal TDS and the signals from the touch electrodes can be amplified and accumulated during each of a rising period and a falling period of the touch driving signal TDS.

Therefore, it is possible to more quickly generate sensing signals.

The above description and the accompanying drawings are merely provided as an example of the technical idea of the present disclosure, and those having ordinary knowledge in the technical field to which the present disclosure pertains will appreciate that various modifications and changes in form, such as combination, separation, substitution, and change of a configuration, may be made to the embodiments described herein without departing from the essential features of the present disclosure. Therefore, the embodiments disclosed in the present disclosure are intended not to limit but to describe the technical idea of the present disclosure, and thus do not limit the scope of the technical idea of the present disclosure. The scope of the present disclosure should be construed based on the appended claims, and all of the technical ideas included within the scope equivalent to the appended claims should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrator comprising:
an amplifier having an inverting input terminal and a non-inverting input terminal, and an output terminal, a reference signal having a pulse waveform being supplied to the non-inverting input terminal;
at least one feedback capacitor, the feedback capacitor coupled to the inverting input terminal and the output terminal;
a first path of switches configured to connect the feedback capacitor between the inverting input terminal and the output terminal of the amplifier during a rising period of the reference signal; and
a second path of switches configured to connect the feedback capacitor between the inverting input terminal and the output terminal of the amplifier during a falling period of the reference signal,
wherein, during each of the rising period and the falling period of the reference signal, a voltage difference between the reference signal and a signal applied to the inverting input terminal of the amplifier is amplified and accumulated, and the amplified and accumulated voltage difference is output,
wherein the first path of switches comprises:
a first rising switch connected between the inverting input terminal of the amplifier and a first electrode of the feedback capacitor; and
a second rising switch connected between the output terminal of the amplifier and a second electrode of the feedback capacitor,
wherein the first and second rising switches are turned on before a rising edge of the reference signal and, the first rising switch is turned on earlier than the second rising switch,
wherein the second path of switches comprises:
a first falling switch connected between the inverting input terminal of the amplifier and the second electrode of the feedback capacitor; and
a second falling switch connected between the output terminal of the amplifier and the first electrode of the feedback capacitor,
wherein the first and second falling switches are turned on before a falling edge of the reference signal, and the first falling switch is turned on earlier than the second falling switch.

2. The integrator of claim 1, wherein the first path of switches and the second path of switches connect the feedback capacitor so that directions of currents flowing through the feedback capacitor during the rising period and the falling period of the reference signal are identical to each other.

3. The integrator of claim 1, further comprising:
a reset switch connected in parallel to the feedback capacitor between the inverting input terminal and the output terminal of the amplifier,
configured to, during the rising period of the reference signal, be turned on after the first and second rising switches are turned off, and
configured to, during the falling period of the reference signal, be turned on after the first and second falling switches are turned off.

4. The integrator of claim 1, wherein, when the at least one feedback capacitor comprises multiple feedback capacitors, the multiple feedback capacitors are connected in parallel to each other, and
further comprising multiple gain control switches connected to at least one of first and second electrodes of the multiple respective corresponding feedback capacitors.

5. The integrator of claim 4, wherein, a total capacitance of the at least one feedback capacitor is changed according to on/off of the gain control switches to adjust an amplification gain of the amplifier.

6. The integrator of claim 3, wherein, the first rising switch and the first falling switch are turned on together during a period for which the reset switch is turned on.

7. A touch display device comprising:
a panel having multiple touch electrodes arranged therein; and
a touch circuit,
wherein the touch circuit comprises:
an integrator circuit configured to generate the sensing signal,
wherein the integrator circuit comprises:
an amplifier configured to receive the touch driving signal through a non-inverting input terminal, and receive the signal from the touch electrode through an inverting input terminal;
at least one feedback capacitor;
a first path switching unit configured to connect the feedback capacitor between the inverting input terminal and an output terminal of the amplifier during the rising period of the touch driving signal; and a second path switching unit configured to connect the feedback capacitor between the inverting input terminal and the output terminal of the amplifier during the falling period of the touch driving signal, wherein the touch circuit is configured to
supply a touch driving signal having a pulse waveform with a rising period and a falling period to at least one touch electrode among the multiple touch electrodes, and generate a sensing signal by amplifying and accumulating a voltage difference between the touch driving signal and a signal received from the touch electrode during each of the rising period and the falling period of the touch driving signal, wherein the first path switching unit comprises:
a first rising switch connected between the inverting input terminal of the amplifier and a first electrode of the feedback capacitor; and
a second rising switch connected between the output terminal of the amplifier and a second electrode of the feedback capacitor,
wherein the first and second rising switches are sequentially turned on before a rising edge of the touch driving signal and, the first rising switch is turned on earlier than the second rising switch, wherein the second path switching unit comprises:
a first falling switch connected between the inverting input terminal of the amplifier and the second electrode of the feedback capacitor; and
a second falling switch connected between the output terminal of the amplifier and the first electrode of the feedback capacitor,
wherein the first and second falling switches are turned on before a falling edge of the touch driving signal, and the first falling switch is turned on earlier than the second falling switch.

8. The touch display device of claim 7, wherein the at least one feedback capacitor comprises multiple feedback capacitors, the multiple feedback capacitors are connected in parallel to each other, and the integrator further comprises multiple gain control switches connected to at least one of first and second electrodes of the multiple respective corresponding feedback capacitors, wherein, a total capacitance of the at least one feedback capacitor is changed according to on/off of the gain control switches so as to adjust an amplification gain of the amplifier.

9. An integrator comprising:
an amplifier having a non-inverting input terminal, an inverting input terminal, and an output terminal;
a feedback capacitor having a first electrode and a second electrode;
a first switch connected between the inverting input terminal of the amplifier and the first electrode of the feedback capacitor;
a second switch connected between the output terminal of the amplifier and the second electrode of the feedback capacitor;

a third switch connected between the inverting input terminal of the amplifier and the second electrode of the feedback capacitor; and
a fourth switch connected between the output terminal of the amplifier and the first electrode of the feedback capacitor,
wherein the first switch is connected between the inverting input terminal of the amplifier and the first electrode of the feedback capacitor; and
the second switch is connected between the output terminal of the amplifier and the second electrode of the feedback capacitor,
wherein the first and second switches are turned on before a rising edge of a signal having a pulse waveform being supplied to the non-inverting input terminal of the amplifier and, the first switch is turned on earlier than the second switch,
wherein the third switch is connected between the inverting input terminal of the amplifier and the second electrode of the feedback capacitor; and
the fourth switch is connected between the output terminal of the amplifier and the first electrode of the feedback capacitor,
wherein the third and fourth switches are turned on before a falling edge of the signal having a pulse waveform being supplied to the non-inverting input terminal of the amplifier, and the third switch is turned on earlier than the fourth switch.

10. The touch display device of claim 7, wherein the first path switching unit and the second path switching unit connect the feedback capacitor so that directions of currents flowing through the feedback capacitor during the rising period and the falling period of the touch driving signal are identical to each other.

11. The touch display device of claim 7, wherein, among a pair of the first rising switch and the second falling switch and a pair of the second rising switch and the first falling switch, one pair thereof has on-terms which partially overlap each other during the rising period or the falling period.

12. The touch display device of claim 7, further comprising:
a reset switch connected in parallel to the feedback capacitor between the inverting input terminal and the output terminal of the amplifier,
configured to, during the rising period of the touch driving signal, be turned on after the first and second rising switches are turned off, and
configured to, during the falling period of the touch driving signal, be turned on after the first and second falling switches are turned off.

13. The touch display device of claim 12, wherein, the first rising switch and the first falling switch are turned on together during a period for which the reset switch is turned on.

* * * * *